United States Patent
Mangino

(10) Patent No.: US 7,330,545 B2
(45) Date of Patent: Feb. 12, 2008

(54) DUAL TRANSFORMER HYBRID SYSTEM AND METHOD

(75) Inventor: Alfred Mangino, Lambertville, NJ (US)

(73) Assignee: Analog Devices Inc., Norwood, MA (US)

( * ) Notice: Subject to any disclaimer, the term of this patent is extended or adjusted under 35 U.S.C. 154(b) by 4 days.

(21) Appl. No.: 10/935,770

(22) Filed: Sep. 8, 2004

(65) Prior Publication Data

US 2006/0067516 A1    Mar. 30, 2006

(51) Int. Cl.
*H04M 1/00* (2006.01)
*H04M 9/00* (2006.01)

(52) U.S. Cl. ..................................... 379/402

(58) Field of Classification Search ........... 379/390.04, 379/391, 402–404
See application file for complete search history.

(56) References Cited

U.S. PATENT DOCUMENTS

| | | | |
|---|---|---|---|
| 4,074,087 A | 2/1978 | Blake, Jr. et al. | |
| 4,096,363 A * | 6/1978 | Earp | 379/403 |
| 4,103,118 A * | 7/1978 | Bergman | 379/402 |
| 5,271,060 A | 12/1993 | Moran, III et al. | |
| 5,426,697 A * | 6/1995 | McGrane | 379/402 |
| 5,541,990 A | 7/1996 | Rahamim | |
| 5,602,912 A | 2/1997 | Hershbarger | |
| 5,822,426 A * | 10/1998 | Rasmus et al. | 379/402 |
| 6,351,185 B1 | 2/2002 | Amrany et al. | |
| 2003/0081761 A1 | 5/2003 | Schley-May | |

FOREIGN PATENT DOCUMENTS

WO    WO 03/094283 A2    4/2003

* cited by examiner

*Primary Examiner*—Curtis Kuntz
*Assistant Examiner*—Alexander Jamal
(74) *Attorney, Agent, or Firm*—Gauthier & Connors LLP

(57) ABSTRACT

A hybrid matching system is disclosed for use with a transmitter and receiver. The hybrid matching system includes a pair of transmitter output nodes for providing a differential transmitter signal for transmission, a pair of receiver input nodes for receiving a differential received signal, a pair of line terminals to interface with a transmission line. The system also includes a first transformer having a first set of windings and a second set of windings, and a second transformer having a first set of windings and a second set of windings. The first set of windings of the first transformer is coupled to the transmitter output nodes. The second set of windings of the first transformer is coupled to the first set of windings of the second transformer. The second set of windings of the second transformer is coupled to the pair of line terminals.

13 Claims, 7 Drawing Sheets

DUAL TRANSFORMER HYBRID SYSTEM AND METHOD

BACKGROUND

The invention generally relates to transformer systems, and relates in particular to transformer hybrid systems for use with modem systems.

Many modem systems include a hybrid matching network to facilitate the transmission of a signal, to permit reception of a signal with reduced attenuation, and to reduce interference from the signal transmission path into the signal reception path. The hybrid matching network provides the interface between the modem circuit and the transmission line, e.g., the tip and ring of the telephone network. The hybrid must provide the proper termination, isolation, signal amplification and hybrid rejection required for modem operation.

In particular, many conventional hybrid networks employ a transformer to provide the required isolation barriers between sensitive electronic circuitry and the telephone line. This transformer is also used to step the transmit (TX) voltage up or down depending on the application. The hybrid network may also properly accept the receive (RX) signal while keeping the TX signal from entering the RX path and contaminating the RX signal (e.g., with an echo signal).

As shown in FIG. 1, a conventional hybrid matching network may include a pair of transmit differential signal nodes 10, 12, a pair of receive differential signal nodes 14, 16, and transmit line differential signal nodes 18, 20 for coupling to the tip and ring of a telephone network. The circuit also includes a balanced Wheatstone bridge including windings (N1) 22, 24 on the integrated circuit side and impedances ($Z_m$) 26, 28 and further includes windings (N2) 30, 32 on the line side. Ideally, impedances ($Z_m$) 26, 28 are chosen to be identical to the reflected line impedances as seen through the N1 windings. Half of the TX signal, therefore, is dropped across each of the N1 windings. The total voltage across the two N2 windings is the TX signal multiplied by the turns ratio N2/N1. The turns ratio may, therefore, be used to control any stepping up or down of the TX signal.

The transmit differential signal nodes 10, 12 should effectively appear to be ground to the RX signal. Each of the N1 windings sees half of the RX signal reflected by the turns ratio. The complete reflected RX signal, therefore, appears at the receive differential signal nodes 14, 16.

The interference rejection (echo rejection) is achieved by employing a balanced bridge such that no component of the TX signal appears at the receive differential signal nodes 14, 16. The closer that the impedance $Z_m$ is matched to the line impedance reflected through the N1 windings, the better the circuit will provide echo rejection. The telephone line may typically be modeled with an RC circuit, although it is sometimes helpful to also include an inductor in $Z_m$ to match the effect of the transformer inductance. The use of inductors in the matching network, however, is not generally desired due to their size, cost and/or noise sensitivity. The matching impedance $Z_m$, therefore, is typically implemented using only resistors and capacitors, and the hybrid matching is typically optimized for a specific desired frequency range.

In certain applications, the swing range of the TX signal may not be large enough to provide the desired voltage to nodes 18 and 20. If a transformer is used to step the TX voltage up on the line side, then the value of the capacitors in $Z_m$ may become too large and/or expensive. For example, a three-fold increase in the turns ratio (e.g., from 1:1 to 1:3) may require a nine fold increase in the size of the required capacitance in $Z_m$.

There is a need, therefore, for more efficient and cost effective implementation of a hybrid matching network.

SUMMARY OF THE INVENTION

In accordance with an embodiment, the invention provides a hybrid matching system for use with a transmitter and receiver. The hybrid matching system includes a pair of transmitter output nodes for providing a differential transmitter signal for transmission, a pair of receiver input nodes for receiving a differential received signal, a pair of line terminals to interface with a transmission line. The system also includes a first transformer having a first set of windings and a second set of windings, and a second transformer having a first set of windings and a second set of windings. The first set of windings of the first transformer is coupled to the transmitter output nodes. The second set of windings of the first transformer is coupled to the first set of windings of the second transformer. The second set of windings of the second transformer is coupled to the pair of line terminals.

BRIEF DESCRIPTION OF THE DRAWINGS

The following description may be further understood with reference to the accompanying drawings in which.

The drawings are shown for illustrative purposes only.

DETAILED DESCRIPTION OF THE ILLUSTRATED EMBODIMENTS

In accordance with certain embodiments, the invention provides hybrid topologies that reduce cost without sacrificing performance in terms of transmit gain, receive gain, hybrid rejection, impedance matching and noise.

Figure 1:
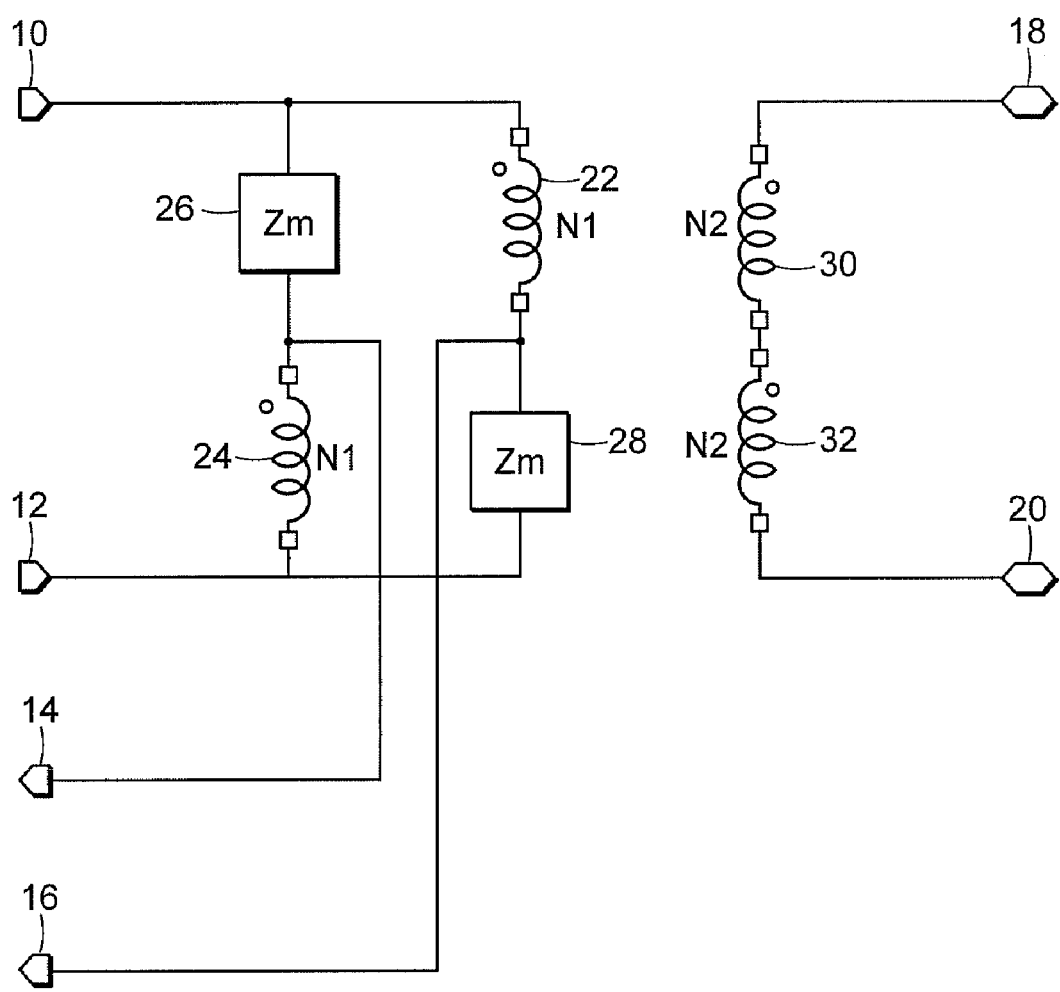
FIG. 1 shows a diagrammatic illustrative view of a transformer bridge hybrid circuit of the prior art.
Figure 2:
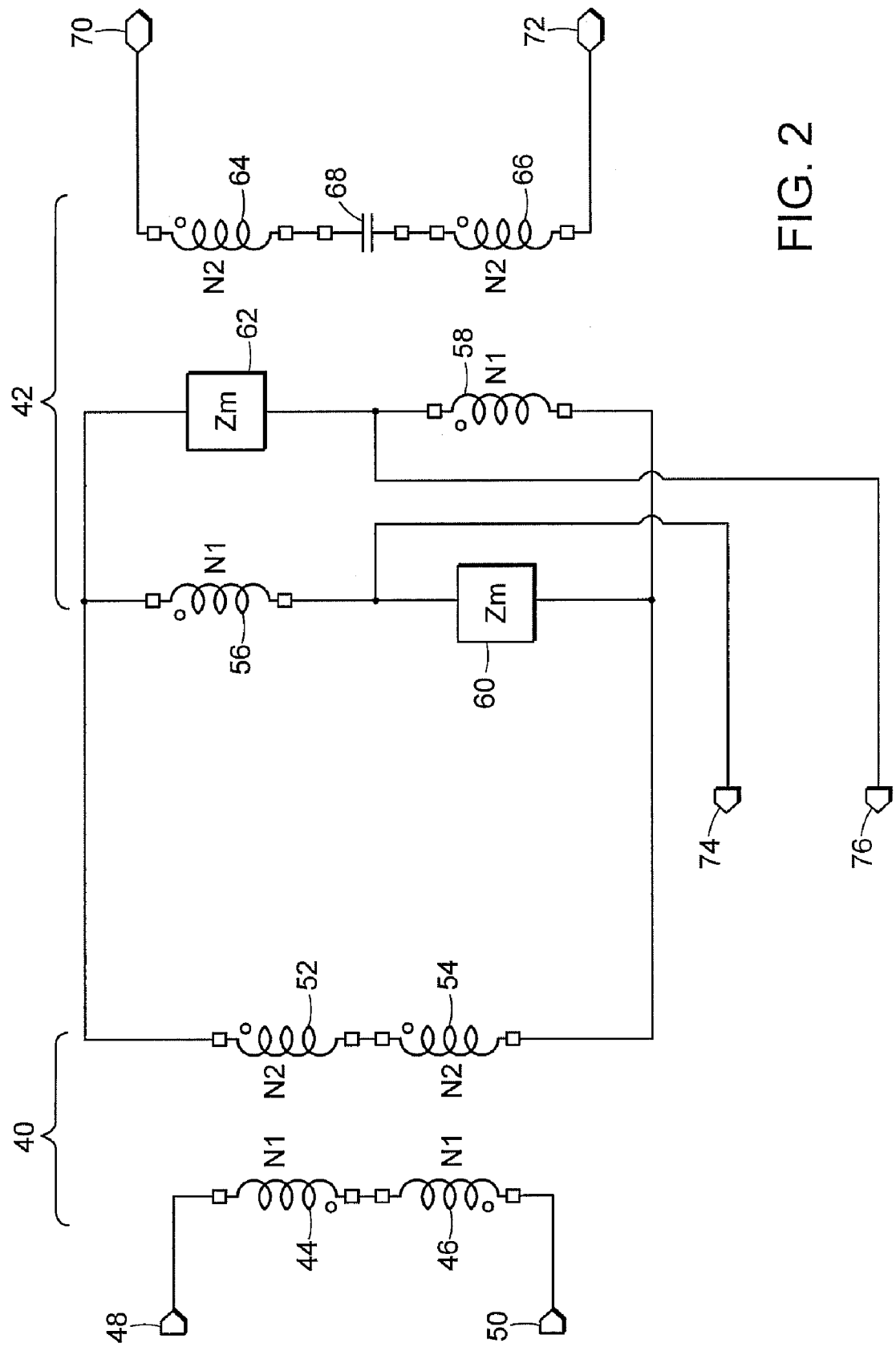
FIG. 2 shows a diagrammatic illustrative view of a transformer bridge hybrid circuit in accordance with an embodiment of the invention.

As shown in FIG. 2, a hybrid circuit in accordance with an embodiment includes two transformers 40 and 42 in series. Transformer 40 includes a first pair of primary transformer windings (N1) 44 and 46 (which are coupled to a differential transmit input signal at nodes 48 and 50) and a pair of secondary transformer windings (N2) 52 and 54. Transformer 42 includes a pair of primary transformer windings (N1) 56 and 58, a pair of impedances ($Z_m$) 60 and 62, and a pair of secondary transformer windings (N2) 64 and 66. The secondary transformer windings 64 and 66 are each coupled to either side of a capacitor 68, and are also coupled to the line at nodes 70 and 72 as shown. A differential received signal is provided at the centers of a balanced bridge that forms the primary side of the transformer 42, and is output at nodes 74 and 76 as shown. In various embodiments, the transformer windings may each include a set of one or more windings.

Transformer 40 provides the TX signal amplification while transformer 42 provides the line interface, hybrid rejection, and line isolation required for proper operation. The topology allows amplification of the TX signal without attenuation of the RX signal. This allows for maximum receive signal to noise ratio without degrading the transmitted signal. Transformer 42 is configured in a conventional bridge topology. Transformer 42 is typically a 1:1 turns ratio but may be used to further amplify the TX signal or to amplify the receive signal in various embodiments.

During transmission, transformer 40 amplifies the TX signal ($V_{tx}$) by an amount equal to its turns ratio N (where N=N2/N1). The output of transformer 40 is $N1*V_{tx}$. If the value of the impedance $Z_m$ is chosen to equal one half of the total reflected line impedance ($Z_r$), then one half of the amplified TX signal would appear across each $Z_m$ and one half would appear across each winding N1 of transformer 42. If transformer 42 has a turns ratio equal to N then the output of transformer 42 would be $N1*N2*V_{tx}$.

During reception, one half of the receive signal ($V_{rx}$) appears across each N2 winding 64 and 66 of transformer 42. The signal at each N1 winding 56 and 58 of transformer 42 is then $½*V_{rx}/N2$. For example, the reflected impedance of transformer 40 may be zero ohms, due to the low impedance of a line driver output, resulting in the RX voltage across each N2 winding of transformer 40 to be zero. The signal across $Z_m$, therefore, is equal to $½*V_{rx}/N2$. When the receive signal is taken differentially at nodes 74 and 76, the output then is $V_{rx}/N2$. Echo cancellation is achieved by careful matching of $Z_m$ to $Z_r/2$. The signal at node 74 would be exactly equal to the voltage at node 76 for the ideal case where $Z_m=Z_r/2$. The differential voltage due to the TX signal taken between nodes 74 and 76 would then be zero for this ideal case.

It is advantageous to have as low a turns ratio as possible for transformer 42 because this will keep the reflected impedance large. This allows smaller value capacitors to be used in the $Z_m$ matching networks thus helping to keep the overall costs down. This topology also allows a cost savings to be realized from transformer 40. Since transformer 40 has no direct connection to the line, it does not have the isolation requirements typical of modem transformers. This results in reduced material costs for the transformer and a lower overall cost for the part.

Figure 3:
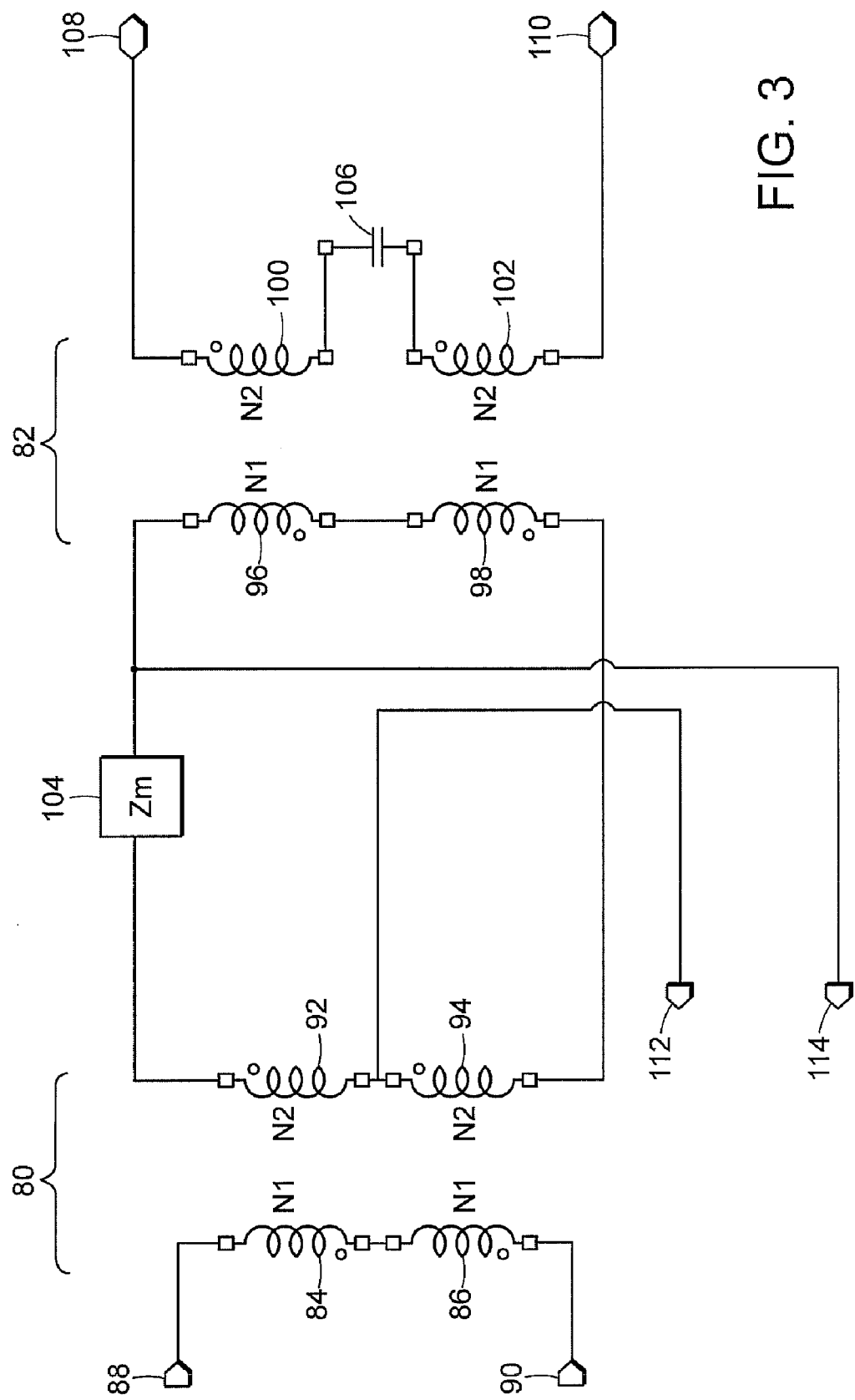
FIG. 3 shows a diagrammatic illustrative view of a transformer bridge hybrid circuit in accordance with another embodiment of the invention.

As shown in FIG. 3, a dual hybrid topology may also be employed with two transformers 80 and 82 in series in accordance with another embodiment of the invention. The transformer 80 provides the TX signal amplification while the transformer 82 provides the line interface, hybrid rejection and line isolation required for proper operation. Transformer 80 includes a first pair of primary transformer windings (N1) 84 and 86 (which are coupled to a differential transmit input signal at nodes 88 and 90) and a pair of secondary transformer windings (N2) 92 and 94. Transformer 82 includes a pair of primary transformer windings (N1) 96 and 98, and a pair of secondary transformer windings (N2) 100 and 102. The circuit also includes an impedance ($Z_m$) 104 between the winding 92 and the winding 96 as shown. The secondary transformer windings 100 and 104 are each coupled to either side of a capacitor 106, and are also coupled to the line at nodes 108 and 110 as shown. A differential received signal is provided from either side of the combined winding 92 and impedance 104, and is output at nodes 112 and 114 as shown.

The topology of FIG. 3 allows amplification of the TX signal without attenuation of the RX signal. This allows for maximum receive signal to noise ratio. Transformer 82 may have a 1:1 turns ratio, or in certain embodiments, may also be used to further amplify the TX signal or to amplify the receive signal.

During transmission, the transformer 80 amplifies the TX signal by an amount equal to its turns ratio N. The output of transformer 80 is $N*V_{tx}$. If $Z_m$ is chosen to equal then the reflected line impedance ($Z_r$), then half of the amplified TX signal would appear across $Z_m$ and half would appear across transformer 82 (T2). If transformer 82 has a turns ratio equal to N then the output of transformer 82 would be $N1*N2*V_{tx}/2$.

Echo cancellation is achieved by careful matching of $Z_m$ to $Z_r$. Each N2 winding of transformer 80 will output a voltage equal to $N1*V_{tx}/2$. The voltage across both $Z_m$ and transformer 82 will also be $N1*V_{tx}/2$ for the ideal case where $Z_m$ equals $Z_r$. The winding N2 of transistor 80 and $Z_m$ have equal but opposite voltages. The differential voltage due to the TX signal at nodes 112 and 114 would then be zero for the ideal case where $Z_m$ is equal to $Z_r$.

During reception, the receive signal $V_{rx}$ appears across the line side of transformer 82. The RX signal at the output of transformer 82 is then $V_{rx}/N2$. The reflected impedance of transformer 80 is zero ohms, due to the low impedance of the line driver output, resulting in the RX voltage across each N2 winding of transformer 80 to be zero. The signal across $Z_m$, therefore, is equal to $V_{rx}/N2$. When the receive signal is taken differentially, the output is $V_{rx}/N2$.

Again, it is advantageous to have as low a turns ratio as possible for T2 because this will keep the reflected impedance large. This allows smaller value capacitors to be used in the $Z_m$ matching network facilitating reduction of overall costs. This topology requires half the number of matching components as the topology shown in FIG. 2 along with twice the impedance value for the matching network. This results in half the number of matching capacitors with each having one half of the capacitance value of those in the topology shown in FIG. 2.

Figure 4:
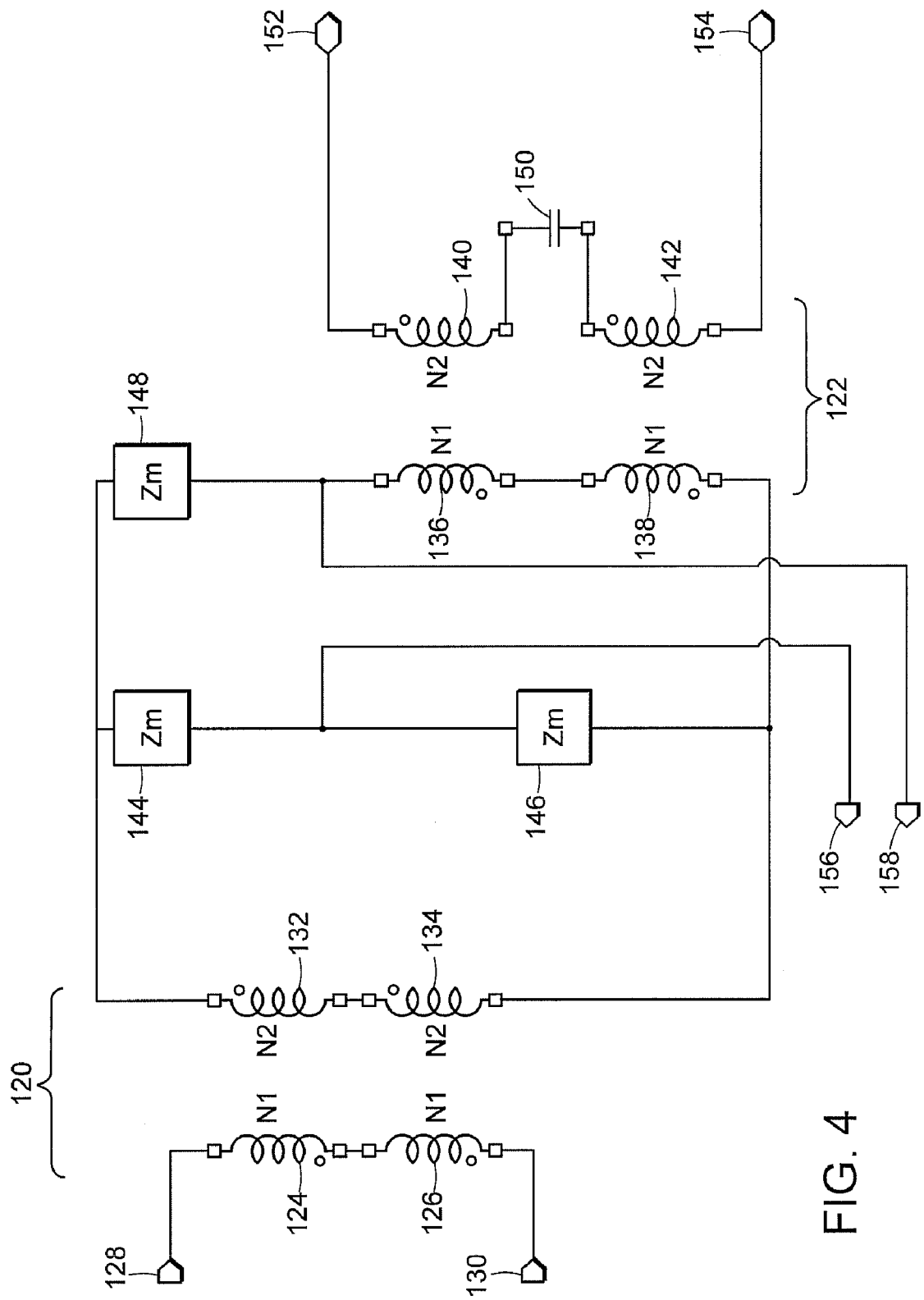
FIG. 4 shows a diagrammatic illustrative view of a transformer bridge hybrid circuit in accordance with a further embodiment of the invention.

FIG. 4 also shows a dual hybrid topology with two transformers 120 and 122 in series in accordance with a further embodiment of the invention. The transformer 120 provides the TX signal amplification while the transformer 122 provides the line interface, hybrid rejection and line isolation required for proper operation. Transformer 120 includes a first pair of primary transformer windings (N1) 124 and 126 (which are coupled to a differential transmit input signal at nodes 128 and 130) and a pair of secondary transformer windings (N2) 132 and 134. The transformer 122 includes a pair of primary transformer windings (N1) 136 and 138, and a pair of secondary transformer windings (N2) 140 and 142. The circuit also includes impedances 144 ($Z_{m1}$) and 146 ($Z_{m2}$) in series with one another across the secondary windings 132 and 134, as well as an impedance 148 ($Z_{m3}$) between the winding 132 and the winding 136 as shown. The secondary transformer windings 140 and 144 are each coupled to either side of a capacitor 150, and are also coupled to the line at nodes 152 and 154 as shown. A differential received signal is provided from a node between the impedances 144 and 146, and from a node between the impedance 148 and the winding 136, and is output at nodes 156 and 158 as shown.

The topology of FIG. 4 also allows amplification of the TX signal without attenuation of the RX signal, which allows for maximum receive signal to noise ratio. The transformer 122 may provide a 1:1 turns ratio but may also be used to further amplify the TX signal or to amplify the receive signal in certain embodiments.

During transmission, the transformer 120 amplifies the TX signal by an amount equal to its turns ratio N. The output of transformer 120 is $N*V_{tx}$. If impedance $(Z_{m3})$ 148 is chosen to equal to the reflected line impedance $(Z_r)$, then half of the amplified TX signal would appear across impedance $(Z_{m3})$ 148 and half would appear across transformer 122. If transformer 122 has a turns ratio equal to N then the output of transformer 122 would be $N1*N2*V_{tx}/2$.

Echo cancellation is achieved by carefully matching the impedance ratio $Z_r'/Z_m'$ to the ratio of $Z_r/Z_m$. The voltage at node 156 would be identical to that at node 158 for the ideal case where $Z_r'/Z_m'$ exactly matches $Z_r/Z_m$. The differential voltage due to the TX signal taken between nodes 156 and 158 would then be zero for this ideal case.

During reception, the receive signal $V_{rx}$ appears across the line side of transformer 122. The RX signal at the output of 122 is then $V_{rx}/N2$. The reflected impedance of transformer 120 is zero ohms, due to the low impedance of the line driver output, resulting in the RX voltage across each N2 winding of transistor 120 being zero. The signal at node 156, therefore, is the full receive signal $V_{rx}/N2$ and the signal at node 158 is zero. When the receive signal is taken differentially, the output is $V_{rx}/N2$.

This topology also requires half the number of matching components as that shown in FIG. 2 but with a scalable impedance value for the matching network. This is because the echo cancellation depends on the ratio of $Z_r'/Z_m'$ and not the direct matching between $Z_m$ and $Z_r$. This results in an even further cost savings.

Figure 5:
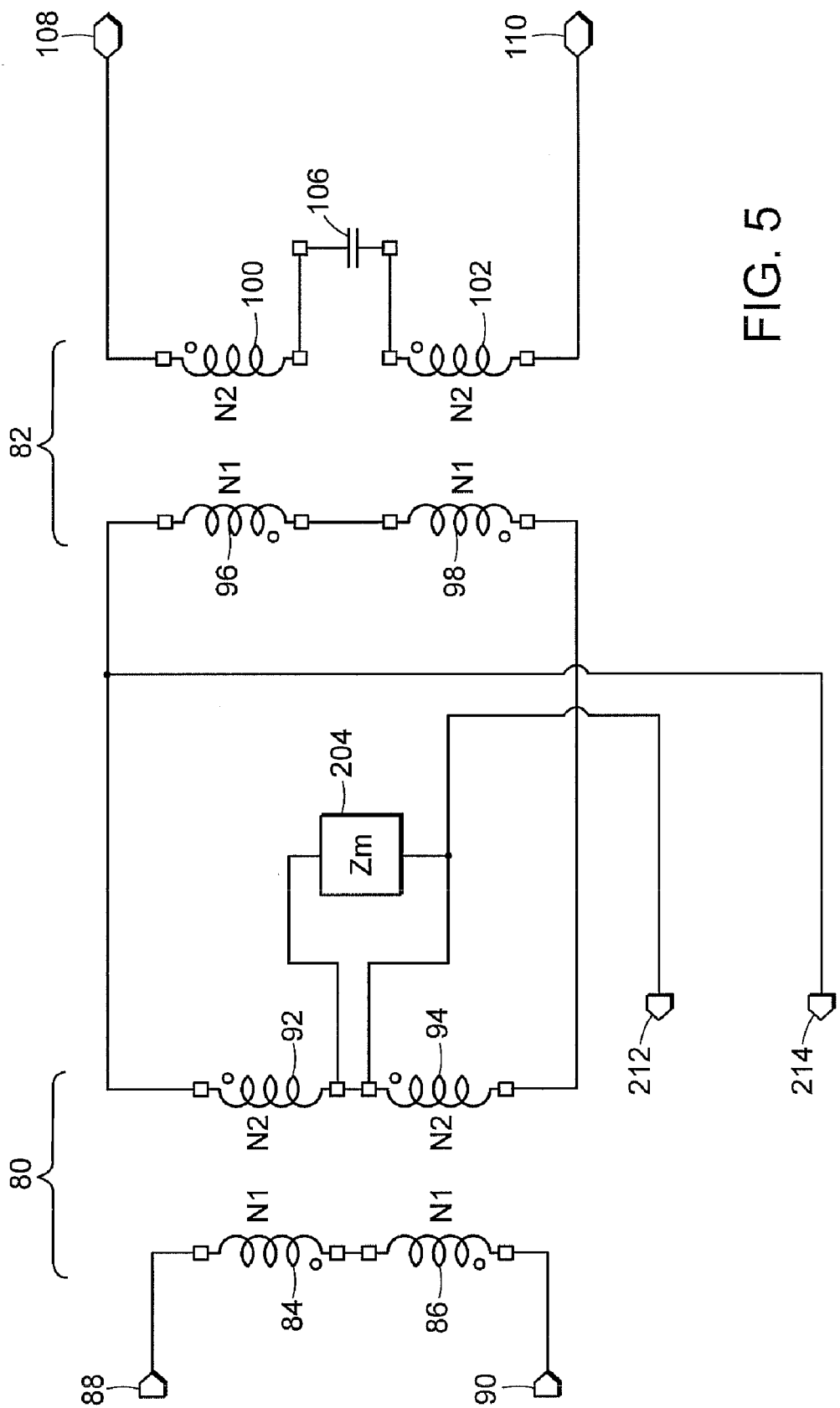
FIG. 5 shows a diagrammatic illustrative view of a transformer bridge hybrid circuit in accordance with another embodiment of the invention.
Figure 6:
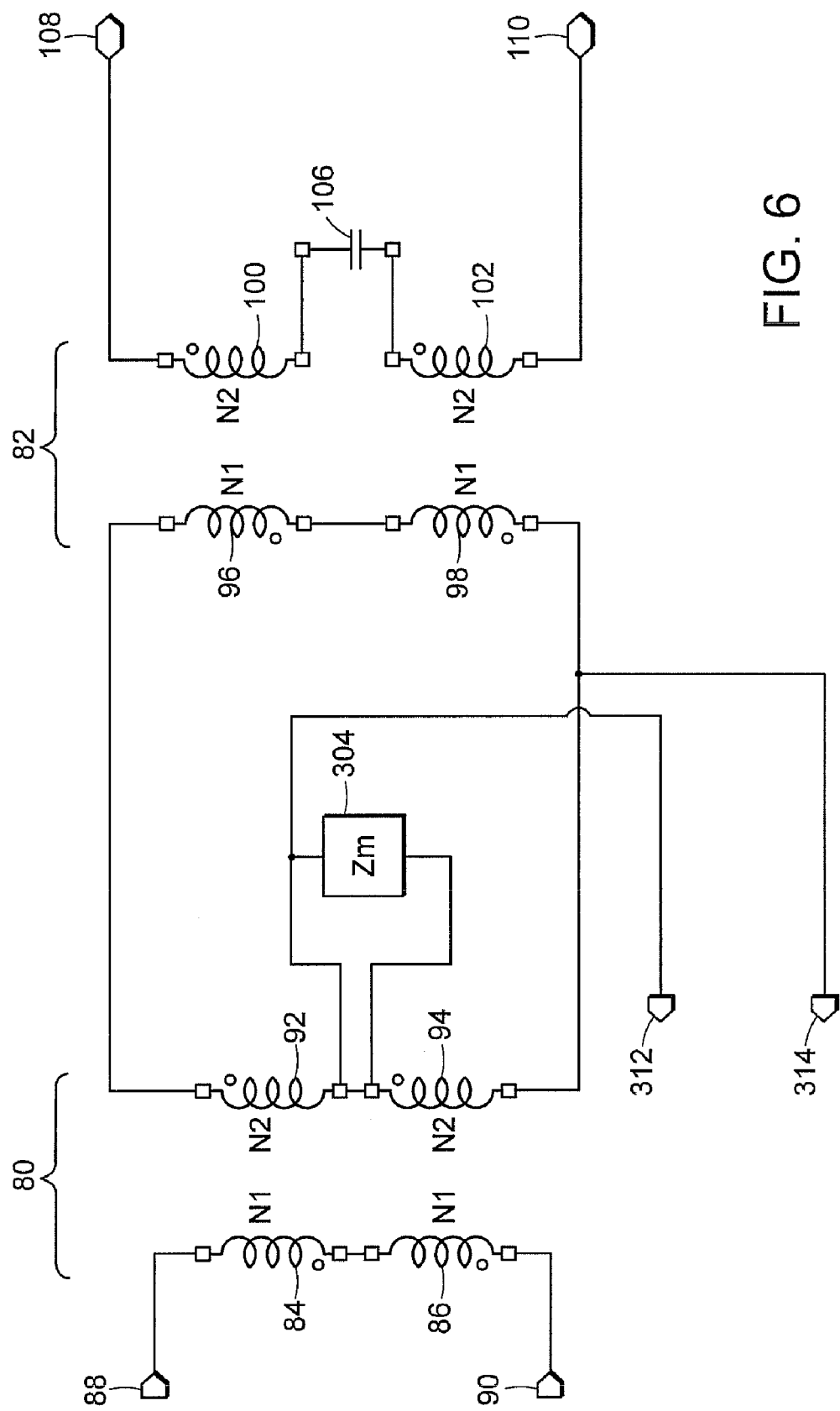
FIG. 6 shows a diagrammatic illustrative view of a transformer bridge hybrid circuit in accordance with another embodiment of the invention.
Figure 7:
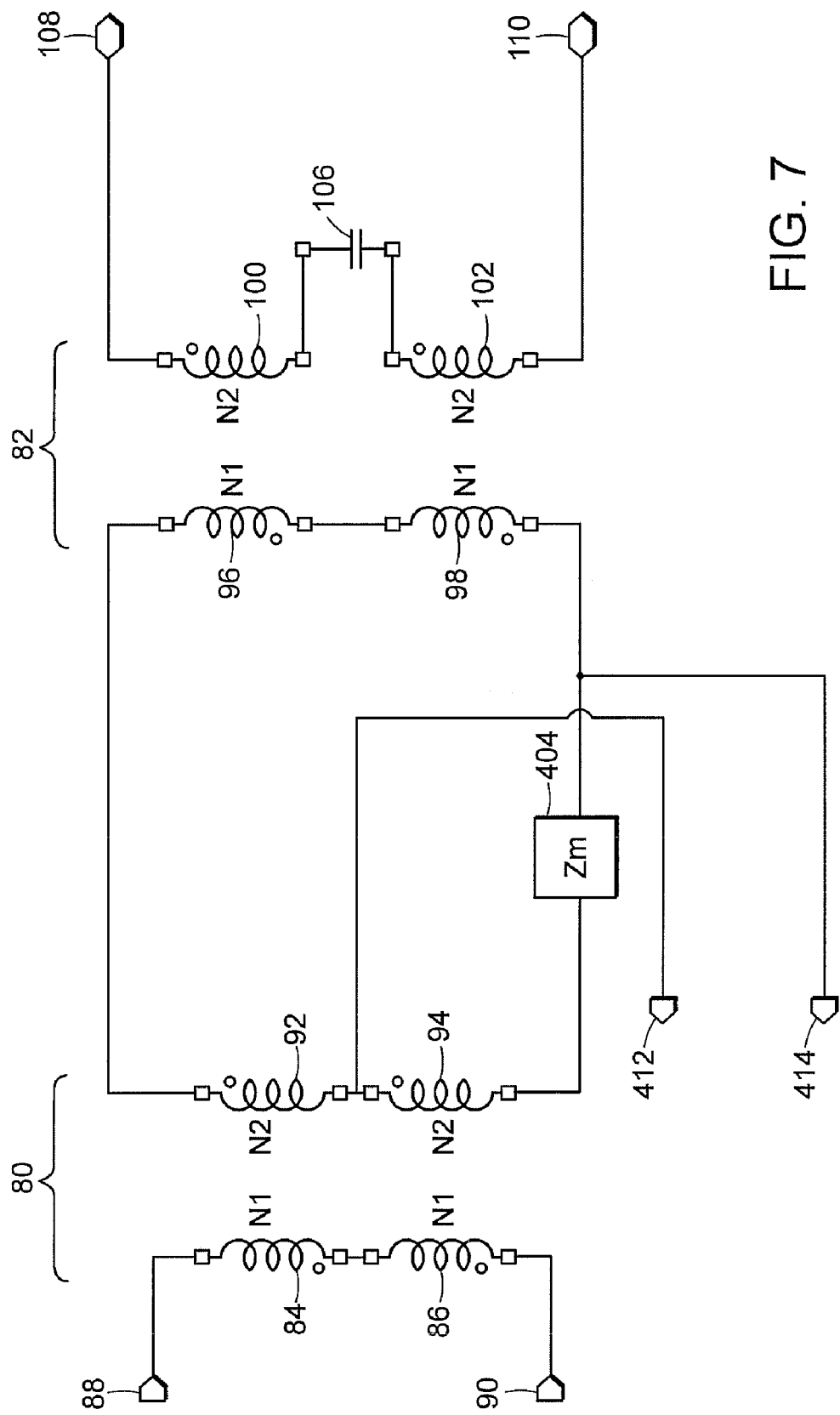
FIG. 7 shows a diagrammatic illustrative view of a transformer bridge hybrid circuit in accordance with another embodiment of the invention.

FIGS. 5, 6 and 7 show systems in accordance with further embodiments of the invention that are similar to the system shown in FIG. 3, except that the impedance $Z_m$ is moved relative the secondary transformer windings of the first transformer, and the received signal output nodes are taken from different places in the circuit. In particular, as shown in FIG. 5, the impedance $Z_m$ 204 may be located between the two secondary transformer windings of the transformer 80, and the received signal output nodes 212 and 214 may be taken from either side of one secondary transformer winding 92 and the impedance 204. As shown in FIG. 6, the impedance $Z_m$ 304 may be located between the two secondary transformer windings of the transformer 80, and the received signal output nodes 312 and 314 may be taken from either side of one secondary transformer winding 94 and the impedance 304. As shown in FIG. 7, the impedance $Z_m$ 404 may be located between the secondary transformer winding 94 of the first transformer 80 and the primary transformer winding 98 of the second transformer 82, and the received signal output nodes 412 and 414 may be taken from either side of one secondary transformer winding 94 and the impedance 404

Those skilled in the art will appreciate that numerous modifications and variations may be made to the above disclosed embodiments without departing from the spirit and scope of the invention.

What is claimed is:

1. A hybrid matching system for use with a transmitter and receiver, said hybrid matching system comprising:
   a pair of transmitter nodes for providing a differential transmitter signal for transmission;
   a pair of receiver nodes for receiving a differential received signal;
   a pair of line terminals to interface with a transmission line;
   a first transformer including a first set of windings coupled to said pair of transmitter nodes, and a second set of winding, said first transformer providing amplification of the differential transmitter signal; and
   a second transformer including:
      a first set of windings, one of which is coupled to said second set of windings of said first transformer via an impedance network,
      a second set of windings, one of which is coupled to one of said pair of line terminals and another of said second set of windings being coupled to another of said pair of line terminals,
      and a capacitor intermediate said one of said second set of windings of said second transformer and the other of said second set of windings of said second transformer;
   said impedance network including a first impedance unit coupled to the second set of windings of said first transformer, a second impedance unit coupled to said first impedance unit and to the second set of windings of said second transformer, and a third impedance unit coupled to the second set of windings of said first transformer and the first set of windings of the second transformer, said first and second impedance units also being coupled to a first receiver node of said pair of receiver nodes, and said third impedance unit being coupled to a second receiver node of said pair of receiver nodes.

2. The hybrid matching system as claimed in claim 1, wherein said first set of windings of said first transformer and said second set of windings of said first transformer each include two windings.

3. The hybrid matching system as claimed in claim 1, wherein said first set of windings of said second transformer and said second set of windings of said second transformer each includes two windings.

4. The hybrid matching system as claimed in claim 1, wherein said first set of windings of said second transformer form a portion of a balanced bridge.

5. The hybrid matching system as claimed in claim 4, wherein said balanced bridge further includes said impedance network.

6. A hybrid matching system for use with a transmitter and receiver, said hybrid matching system comprising:
   a pair of transmitter nodes for receiving a differential transmitter signal for transmission on a transmission line;
   a pair of receiver nodes for providing a differential received signal from the transmission line;
   a pair of line terminals to interface with the transmission line;
   a first transformer including a first pair of windings coupled to said pair of transmitter nodes, and a second pair of windings, said first transformer providing amplification of a said differential transmitter signal;
   a second transformer including a first pair of windings, and a second pair of windings that are coupled to said pair of line terminals, said second pair of windings of said second transformer being coupled to each another by a capacitor; and
   an impedance circuit that includes:
      first and second impedance units in parallel with said second pair of windings of the first transformer such that the first impedance unit is coupled to a first of the second pair of windings of said first transformer, and the second impedance unit is coupled to a second of the second pair of windings of said first transformer, and wherein one of the pair of receiver nodes is coupled to each of the first and second impedance units; and a third impedance unit coupled to the first of the second pair of windings of the first transformer and coupled to another of the first pair of windings of the second transformer.

7. A hybrid matching system for use with a transmitter and receiver, said hybrid matching system comprising:

a first transformer providing amplification of a transmitter input signal including:

a first primary winding and a second primary winding that are coupled to a first transmitter node and a second transmitter node, said first and second transmitter nodes for receiving a differential transmitter signal for transmission on a transmission line, and a first secondary winding and a second secondary winding, said first secondary winding being coupled to a first impedance unit that is connected in series with a second impendence unit such that said second secondary winding of the first transformer is coupled to the second impedance unit;

a second transformer providing isolation of first and second transmission line terminals including:

a first primary winding coupled to the first secondary winding of the first transformer via a third impedance unit and to a first receiver node for providing a differential received signal from a transmission line together with a second receiver node that is coupled to each of the first and second impedance units, and a second primary winding coupled to the second secondary winding of the first transformer, and a first secondary winding coupled to the first line terminal of the transmission line, and a second secondary winding coupled to the second line terminal of the transmission line, said first and second secondary windings of the second transformer also being coupled to each other via a capacitor.

8. The hybrid matching system as claimed in claim 7, wherein one half of a transmission signal from said first transformer is presented across the third impedance unit, and one half of the transmission signal from said first transformer is presented across the first set of windings of said second transformer.

9. The hybrid matching system as claimed in claim 7, wherein a signal at the first receiver input node is a full receive signal, and a signal at the second receiver input node is zero.

10. The hybrid matching system as claimed in claim 7, wherein said first secondary winding of said first transformer has the same number of windings as said second secondary winding of said first transformer.

11. The hybrid matching system as claimed in claim 7, wherein one half of an amplified transmission signal at the first and second transmitter nodes is provided across the third impedance unit.

12. The hybrid matching system as claimed in claim 7, wherein one half of an amplified transmission signal at the first and second transmitter nodes is provided across the second transformer.

13. The hybrid matching system as claimed in claim 7, wherein a differential voltage at the first and second receiver input nodes due to a transmission differential voltage being provided at the first and second transmitter nodes is zero.

* * * * *